United States Patent [19]
Rix et al.

[11] Patent Number: 5,666,268
[45] Date of Patent: Sep. 9, 1997

[54] ELECTRONIC VARIABLE SPEED DRIVE HAVING A PROTECTIVE COVER BETWEEN AN OPENING DOOR AND ELECTRONIC CONTROL AND POWER SYSTEMS

[75] Inventors: Philippe Rix, Paris; Ghislaine Mercier, Montesson; Jacques Cerri, Chapet; Philippe Mansuy, Cergy, all of France

[73] Assignee: Schneider Electric S.A., Boulogne-Billancourt, France

[21] Appl. No.: 696,191

[22] Filed: Aug. 13, 1996

Related U.S. Application Data

[63] Continuation of Ser. No. 361,588, Dec. 22, 1994, abandoned.

[30] Foreign Application Priority Data

Dec. 22, 1993 [FR] France ............... 93 15622

[51] Int. Cl.$^6$ ............................ H02B 1/04
[52] U.S. Cl. .................. 361/692; 361/115; 361/648; 361/797; 363/141
[58] Field of Search ............... 174/35 R, 52.1; 363/141, 37; 361/115, 644, 648, 656, 679, 681, 689, 690, 692, 693–697, 715–722, 724, 736, 728–730, 752, 755, 759, 784, 785, 796, 797, 816, 800–803, 818, 823

[56] References Cited

U.S. PATENT DOCUMENTS

| | | | |
|---|---|---|---|
| 3,904,937 | 9/1975 | Levin | 361/818 |
| 4,488,701 | 12/1984 | Webb | 361/334 |
| 4,642,733 | 2/1987 | Schacht | 361/363 |
| 4,908,734 | 3/1990 | Fujioka | 363/141 |
| 4,908,738 | 3/1990 | Kobari et al. | |
| 5,081,560 | 1/1992 | Donnerstag | 361/644 |
| 5,134,543 | 7/1992 | Sharp | 361/358 |
| 5,351,176 | 9/1994 | Smith | 361/681 |
| 5,555,156 | 9/1996 | Decante | 361/683 |

FOREIGN PATENT DOCUMENTS

| | | |
|---|---|---|
| 0 103 412 | 3/1984 | European Pat. Off. |
| 0 356 991 | 3/1990 | European Pat. Off. |
| 34 12 510 | 10/1984 | Germany |
| 2 271 679 | 4/1994 | United Kingdom |

*Primary Examiner*—Gerald P. Tolin
*Attorney, Agent, or Firm*—Oblon, Spivak, McClelland, Maier & Neustadt, P.C.

[57] ABSTRACT

An electronic variable speed drive including a cabinet having an opening door, a power system supplied with power from an AC line voltage and delivering a voltage under the control of solid state power switches and an electronic control system controlling the solid state switches. The cabinet contains, behind the door, a protective cover which protects the electronic control system and the power system which are disposed behind it. When the door is open, the protective cover protects users from the control and power systems.

5 Claims, 2 Drawing Sheets

5,666,268

ELECTRONIC VARIABLE SPEED DRIVE HAVING A PROTECTIVE COVER BETWEEN AN OPENING DOOR AND ELECTRONIC CONTROL AND POWER SYSTEMS

This application is a continuation of application Ser. No. 08/361,588, filed on Dec. 22, 1994, now abandoned.

BACKGROUND OF THE INVENTION

1. Field of the Invention

The present invention concerns an electronic variable speed drive including, in a cabinet having an opening door, a power system connected to an AC line voltage and delivering a voltage under the control of solid state power switches, and an electronic control system controlling the solid state switches.

2. Description of the Prior Art

Electronic variable speed drives are routinely used in association with DC and AC motors to drive the motor at variable speed.

Variable speed drives known as frequency converters for controlling the speed of AC motors derive from the single-phase or three-phase AC line voltage an AC voltage whose rms value and frequency vary according to a predetermined law. These frequency converters essentially comprise a rectifier supplying a DC voltage to a smoothing (filter) capacitor (AC-DC converter) and a power transistor inverter (DC-AC converter) energized by the filtered DC voltage.

The rectifier is a rectifier bridge connected to a single-phase or three-phase AC line voltage. The inverter is connected to the phase windings of the motor and produces an AC voltage from the DC voltage supplied by the rectifier.

The power transistors are controlled by pulse width modulation (PWM) to generate a voltage as close as possible to a true sinusoid.

Patent EP-A-0 103 412 and patent DE-A-3 412 510 describe electronic variable speed drives. These prior art variable speed drives do not provide sufficient protection.

An object of the present invention is to provide a variable speed drive in which the protection arrangements are designed to allow maintenance or repair personnel access to functional parts of the variable speed drive while the latter is operating. Optional circuit boards can also be fitted or removed in complete safety, whether the product is live or not. The protection arrangements are designed to prevent metal and conductive dust particles falling vertically into the unit disturbing its operation, to guarantee protection of personnel and to enable dissipation of heat from internal components of the variable speed drive which operate at raised temperature. The protection category of the cabinet is IP30 with the door closed and IP20 with the door open.

SUMMARY OF THE INVENTION

The invention consists in an electronic variable speed drive including, in a cabinet having an opening door, a power system supplied with power from an AC line voltage and delivering a voltage under the control of solid state power switches and an electronic control system controlling the solid state switches, in which variable speed drive the cabinet contains, behind the door, a protective cover to protect the electronic control system and the power system which are disposed behind it and which, when the door is open, protects users from the control and power systems, and the protective cover has means for mounting between it and the door an optional electronic module which connects to the electronic control system.

In accordance with one feature of the invention the optional electronic module is an electronic circuit board housed in an insulative container and provided with a connector adapted to be inserted into a window in the protective cover.

In accordance with another feature of the invention the protective cover incorporates at least one window enabling access to at least one connector mounted on a circuit board of the electronic control system.

In accordance with another feature of the invention the protective cover carries signalling means which show through a window in the door.

In accordance with another feature of the invention the door incorporates a window in which is housed a dialog console.

In accordance with another feature of the invention the protective cover has a closed rim which is adapted to receive the dialog console and provides a seal to the perimeter of the window.

In accordance with another feature of the invention the cabinet comprises a front part containing the electronic system and a rear part containing the cooling system and is closed by a heatsink support plate, the two parts being assembled together in a demountable manner.

The invention will now be described in more detail with reference to one embodiment of the invention shown by way of example in the appended drawings.

DETAILED DESCRIPTION OF THE PREFERRED EMBODIMENT

Figure 1:
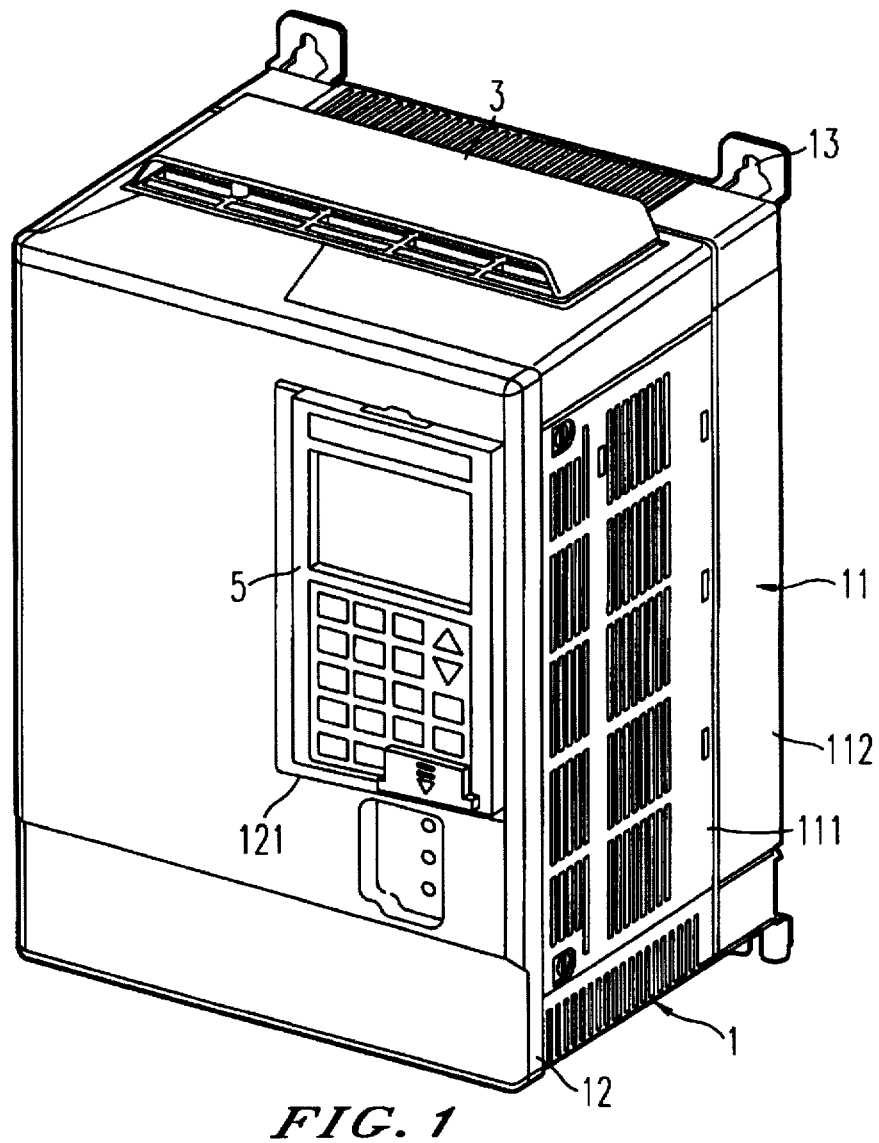
FIG. 1 is an exterior perspective view of the electronic variable speed drive of the invention.
Figure 2:
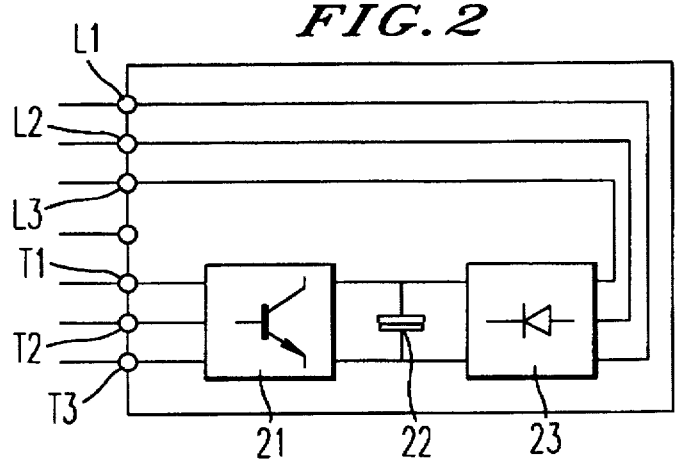
FIG. 2 is a functional block schematic of the electronic variable speed drive.

The electronic variable speed drive shown in the drawings is a frequency converter suitable for an asynchronous motor.

The electronic variable speed drive has a cabinet 1 comprising a cabinet body 11 and a door 12 mounted on the cabinet body on hinges at the side so that it pivots above a vertical axis. The closed door is locked to the cabinet body by means of a known type lock. The cabinet 1 is fixed to a support by means of fixing lugs 13 fixed to the rear of the cabinet. The bottom of the cabinet includes a cable entry plate 14. The sides of the cabinet include ventilation holes.

The cabinet 1 contains a power electronic system 2 which includes an inverter 21 connected by filter capacitors 22 to a diode rectifier 23 connected by terminals $L_1$, $L_2$, $L_3$ to the phase conductors of the three-phase AC line voltage. Each arm of the inverter includes two solid state power switches with associated recovery diodes. The mid-points of the pairs of switches are connected by terminals $T_1$, $T_2$, $T_3$ to the phase windings of the motor. These switches are bipolar or MOS transistors or bipolar MOS components such as insulated gate bipolar transistors (IGBT) or gate turn-off (GTO) thyristors or other like switch mode components.

The various power switches and the diodes are mounted on a power circuit board 24. The input terminals ($L_1$, $L_2$, $L_3$) making the connection between the diode rectifier and the phase conductors and the terminals $T_1$, $T_2$, $T_3$ making the connection to the motor phases constitute power terminals 241 which is fixed to the power circuit board 24 and which includes terminal protection means. The power circuit board 24 is mounted on a heatsink support 26 carrying a heatsink 25 for cooling the solid state power switches. The heatsink support 26 delimits a chamber at the rear of the cabinet and fans 27 cool the rear of the heatsink 25 to enhance the cooling effect. A control terminal block 242 is fixed to the circuit board 24.

The parameters of the variable speed drive can be controlled via a graphics type dialog console 5 flush with a window 121 in the door 12.

The cabinet contains an electronic control system 4 controlling the solid state switches mounted on the power circuit board 24. This electronic control system includes a control circuit board 41 connected electrically to the power circuit board 24. The power circuit board 24 and the control circuit board 41 are separated by an electrostatic screen 43.

The control circuit board 41 carries a card reader connector 411 to the PCMCIA (Personal Computer Memory Card International Association) or any other similar standard, a connector 412 for the connection to the dialogue console 5 and a connector 413 for connecting an optional add-on module 6. The circuit board also carries a control terminal block 414.

The cabinet 1 contains an insulative plastics material protective cover 42 which when the door 12 is open conceals and protects the electronic control system and the power system. This protective cover 42 shuts off the major part of the body of the cabinet and is adjacent to the control circuit board 41. It is visible as soon as the door 12 is opened and protects the operator against electrical shock. The power terminals 241 which remain accessible at the side of the protective cover 242 are protected terminals so that protection is total.

The optional add-on module 6 is accommodated between the protective cover 42 and the door 12.

The protective cover 42 includes a window 423 for inserting a PCMCIA card into the connector 411, a window 421 providing access to the connector 412 and a window 422 providing access to the connector 413. The window 421 accepts the connector at the rear of the dialogue console 5 which plugs into the connector 412. The window 422 accepts the connector at the rear of the add-on module 6 which plugs into the connector 413.

The protective cover 42 carries signalling means 424 which show through a window 122 in the door 12. The The protective cover 42 has a closed lip 425 which is adapted to receive the dialogue console 5 and provides a seal around the window 121.

The optional add-on module 6 which mounts between the protective cover 42 and the door 12 comprises an electronic circuit board in a container 61 to protect the electronic components on the board from impact and electrostatic shock and to protect personnel against direct contact with live parts. This container 61 enables fitting, removal and replacement of options in total safety, whether the variable speed drive is live or not.

The cabinet 11 has on the top, above the ventilation holes, a plastics material screen 3 to prevent metal or conductive dust particles dropping vertically into the unit, guarantee protection of personnel and enable dissipation of heat from internal components of the variable speed drive which operate at raised temperature.

The screen 3 provides a ventilation space above the ventilation holes to enable circulation of air whilst preventing ingress of particles.

The cabinet body 11 has a plastics material frame 111 at the front and a metal back 112 which are attached together in a demountable manner. The frame 111 contains the electronic part (power part and control part). The back 112 contains the heatsink and the associated components and is closed by the heatsink support plate 26.

The frame 111 which contains the electronic part (power and control) supports the power circuit board 24, the control circuit board 41, the screen 43 and the protective cover 42. The circuit boards or other constituent parts of the electronics are fixed to the inside of the frame 111.

The rear part 112 containing the cooling equipment can be separated from the front part 111 containing the electronics. This arrangement enables the components which operate at raised temperature to remain outside a sealed enclosure.

Figure 3:
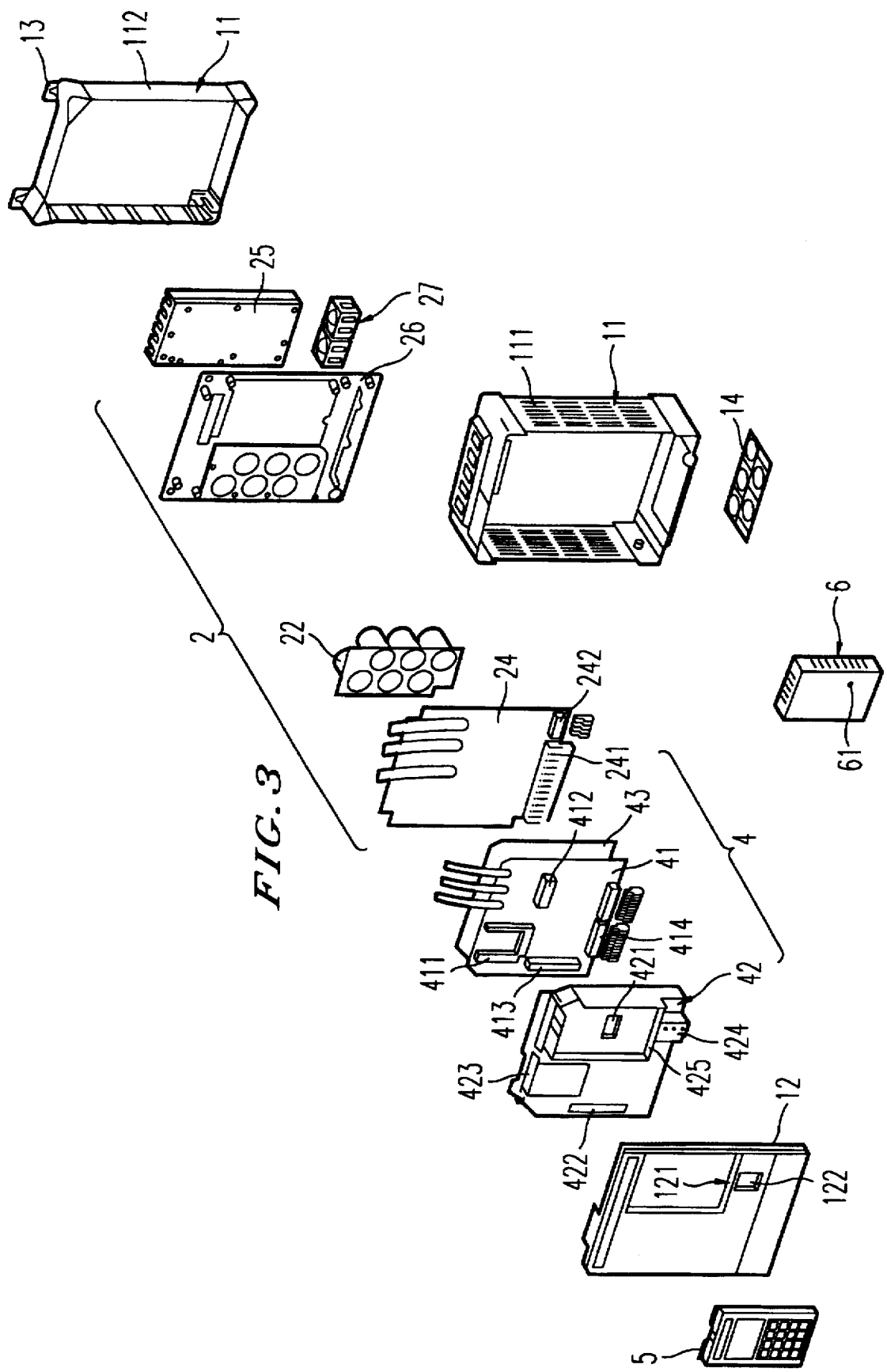
FIG. 3 is an exploded view of the variable speed drive from FIG. 1.

To carry out the assembly a rectangular opening must be made in the heatsink support 26 shown in FIG. 3, of the enclosure. A gasket is disposed between the frame 111 and the heatsink support 26 and the two parts 111 and 112 are mounted on opposite side of the heatsink support 26. The two parts are fastened to the heatsink support 26 by screws which compress the gasket.

It is to be understood that variants of the embodiments of the invention described, improvements of details of these embodiments and the replacement of means as described with equivalent means all lie within the scope of the invention.

There is claimed:

1. In an electronic variable speed drive including, in a cabinet having an opening door, a power system supplied with power from an AC line voltage and delivering a voltage under the control of solid state power switches and an electronic control system controlling said solid state switches, the improvement comprising:

a window located in said opening door and receiving a dialog box;

a protective cover located between said opening door and said electronic control system and power system and provided with means connecting said dialog box to said electronic system and with means holding said dialog box; and wherein said protective cover includes window means for receiving a PCMCIA card.

2. Variable speed drive according to claim 1, wherein said protective cover comprises:

means for connecting an optional electronic module to said electronic control system so as to mount said optional electronic module-between said protective cover and said opening door.

3. Variable speed drive according to claim 1 or 2, wherein the protective cover comprises signalling means which show through a window in the door.

4. Variable speed drive according to claim 1 or 2, wherein said cabinet comprises a rear part including a heatsink support carrying a heatsink, and a separate front part containing circuits boards.

5. Variable speed drive according to claim 1 or 2, wherein said cabinet comprises ventilation holes provided on a top of the cabinet, and a screen mounted above the ventilation holes and providing a ventilation space above the ventilation holes.

\* \* \* \* \*